(12) United States Patent
Aiello et al.

(10) Patent No.: US 10,209,283 B2
(45) Date of Patent: *Feb. 19, 2019

(54) ELECTRICAL PHASE IDENTIFICATION (71) Applicant: Itron, Inc., Liberty Lake, WA (US)

(72) Inventors: Roberto Aiello, Bend, OR (US);
Patrick Amihood, San Francisco, CA (US)

(73) Assignee: Itron, Inc., Liberty Lake, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/431,473

(22) Filed: Feb. 13, 2017

(65) Prior Publication Data
US 2017/0168098 A1 Jun. 15, 2017

Related U.S. Application Data (63) Continuation of application No. 14/531,845, filed on Nov. 3, 2014, now Pat. No. 9,568,522.
(Continued)

(51) Int. Cl.
*G01R 25/00* (2006.01)
*G01R 19/00* (2006.01)
(Continued)

(52) U.S. Cl.
CPC ............ *G01R 25/005* (2013.01); *G01R 11/40* (2013.01); *G01R 19/2513* (2013.01);
(Continued)

(58) Field of Classification Search
CPC .. G01R 25/005; G01R 31/44; G01R 19/2513; G01R 23/005; G01R 25/00; G01R 11/40;
(Continued)

(56) References Cited

U.S. PATENT DOCUMENTS

| 4,146,841 | A | 3/1979 | McRae |
| 4,532,471 | A | 7/1985 | Hurley |
| (Continued) | | | |

FOREIGN PATENT DOCUMENTS

| DE | 102008044915 | 3/2010 |
| DE | 102013106393 | 12/2013 |
| (Continued) | | |

OTHER PUBLICATIONS

Australian Office Action dated Mar. 17, 2017 for Australian Patent Application No. 2015223145, a counterpart foreign application of U.S. Appl. No. 14/280,286, 4 pages.
(Continued)

*Primary Examiner* — Hoai-An D. Nguyen
(74) *Attorney, Agent, or Firm* — Lee & Hayes, P.C.

(57) ABSTRACT

An electrical phase (e.g., a phase from among three-phase power) connected to an electrical meter may be determined. In one example of the techniques, changes in energy or power (e.g., a derivative or differences) may be determined based at least in part on measurements from each of a plurality of meters. Changes in energy or power may be determined based at least in part on electrical transmissions measured at each of the phases of a feeder. A meter may be selected from among the plurality of meters. For each of the plurality of electrical phases, the changes in energy or power measured by the meter may be compared or correlated to the changes in energy or power measured at the feeder. A phase that is connected to the meter may be determined, from among the plurality of electrical phases, based at least in part on the comparisons or correlations.

20 Claims, 8 Drawing Sheets

Related U.S. Application Data (60) Provisional application No. 62/066,248, filed on Oct. 20, 2014.

(51) Int. Cl.
| | | |
|---|---|---|
| G01R 31/04 | (2006.01) | |
| G01R 11/40 | (2006.01) | |
| G01R 19/25 | (2006.01) | |
| H02J 3/26 | (2006.01) | |
| H02J 13/00 | (2006.01) | |
| G01R 31/44 | (2006.01) | |
| G01R 31/02 | (2006.01) | |

(52) U.S. Cl.
CPC ........... G01R 25/00 (2013.01); G01R 31/041 (2013.01); G01R 31/44 (2013.01); H02J 3/26 (2013.01); H02J 13/0006 (2013.01); *G01R 31/023* (2013.01); *Y02E 40/50* (2013.01)

(58) Field of Classification Search
CPC ....... G01R 31/023; G01R 31/041; H02J 3/26; H02J 13/0006; H02H 3/302; H02H 3/353; H02H 3/382; G01P 3/565; Y02E 40/50
USPC ........... 702/1, 57, 60, 61, 64; 324/66, 76.11, 324/76.77, 103 R, 107, 522, 709, 713, 324/764.01
See application file for complete search history.

(56) References Cited

U.S. PATENT DOCUMENTS

| | | | |
|---|---|---|---|
| 4,930,064 A | 5/1990 | Tanaka et al. | |
| 5,184,119 A | 2/1993 | Stanbury et al. | |
| 5,617,329 A | 4/1997 | Allison et al. | |
| 5,673,196 A * | 9/1997 | Hoffman | G01R 21/1331 324/141 |
| 5,831,423 A | 11/1998 | Mancini | |
| 5,920,720 A | 7/1999 | Toutonghi et al. | |
| 6,334,050 B1 | 12/2001 | Skarby | |
| 6,456,097 B1 | 9/2002 | Sutherland | |
| 7,272,518 B2 | 9/2007 | Bickel et al. | |
| 7,523,185 B1 | 4/2009 | Ng et al. | |
| 7,583,197 B2 | 9/2009 | Wesby Van Swaay | |
| 7,936,163 B2 | 5/2011 | Lee, Jr. | |
| 8,094,010 B2 | 1/2012 | Wesby-van Swaay | |
| 8,283,911 B1 | 10/2012 | Bierer | |
| 8,301,386 B1 | 10/2012 | Redmond et al. | |
| 8,639,391 B1 | 1/2014 | Alberth, Jr. et al. | |
| 8,797,018 B2 | 8/2014 | Watkins et al. | |
| 9,031,800 B2 | 5/2015 | Filippenko et al. | |
| 9,230,429 B2 | 1/2016 | McKinley et al. | |
| 2005/0063317 A1 | 3/2005 | Risberg et al. | |
| 2005/0177646 A1 | 8/2005 | Kawano et al. | |
| 2006/0071776 A1 | 4/2006 | White, II et al. | |
| 2006/0167981 A1 | 7/2006 | Bansod et al. | |
| 2007/0247331 A1 | 10/2007 | Angelis et al. | |
| 2008/0089390 A1 | 4/2008 | Picard | |
| 2009/0045976 A1 | 2/2009 | Zoldi et al. | |
| 2009/0276170 A1 | 11/2009 | Bickel | |
| 2009/0299660 A1 | 12/2009 | Winter | |
| 2010/0002348 A1 | 1/2010 | Donolo et al. | |
| 2010/0007336 A1 | 1/2010 | de Buda | |
| 2010/0060259 A1 | 3/2010 | Vaswani et al. | |
| 2010/0088431 A1 | 4/2010 | Oshins et al. | |
| 2010/0134089 A1 | 6/2010 | Uram et al. | |
| 2010/0142447 A1 | 6/2010 | Schlicht et al. | |
| 2010/0179704 A1 | 7/2010 | Ozog | |
| 2011/0116387 A1 | 5/2011 | Beeco et al. | |
| 2011/0122798 A1 | 5/2011 | Hughes et al. | |
| 2011/0126176 A1 | 5/2011 | Kandasamy et al. | |
| 2011/0215945 A1 | 9/2011 | Peleg et al. | |
| 2011/0254525 A1 | 10/2011 | Gaknoki et al. | |
| 2012/0062210 A1 | 3/2012 | Veillette | |
| 2012/0117392 A1 | 5/2012 | Turicchi, Jr. et al. | |
| 2012/0126636 A1 | 5/2012 | Atsumi | |
| 2012/0169300 A1 | 7/2012 | Rouaud et al. | |
| 2012/0181974 A1 | 7/2012 | Kuniyosi et al. | |
| 2012/0198037 A1 | 8/2012 | Shelby et al. | |
| 2012/0201195 A1 | 8/2012 | Rausch et al. | |
| 2012/0229089 A1 | 9/2012 | Bemmel et al. | |
| 2013/0024149 A1 | 1/2013 | Nayar et al. | |
| 2013/0035885 A1 | 2/2013 | Sharon et al. | |
| 2013/0076534 A1 | 3/2013 | Conant et al. | |
| 2013/0101003 A1 | 4/2013 | Vedantham et al. | |
| 2013/0110425 A1 | 5/2013 | Sharma et al. | |
| 2013/0241746 A1 | 9/2013 | McKinley et al. | |
| 2013/0242867 A1 | 9/2013 | Bell | |
| 2013/0275736 A1 | 10/2013 | Kelley et al. | |
| 2013/0278437 A1 | 10/2013 | Wyk | |
| 2013/0335062 A1 | 12/2013 | de Buda et al. | |
| 2014/0005964 A1 | 1/2014 | Rouaud et al. | |
| 2014/0012524 A1 | 1/2014 | Flammer, III | |
| 2014/0032506 A1 | 1/2014 | Hoey et al. | |
| 2014/0039818 A1 | 2/2014 | Arya et al. | |
| 2014/0049109 A1 | 2/2014 | Kearns et al. | |
| 2014/0074670 A1 | 3/2014 | Garrity et al. | |
| 2014/0161114 A1 | 6/2014 | Shuey | |
| 2014/0173600 A1 | 6/2014 | Ramakrishnan Nair | |
| 2014/0214218 A1 | 7/2014 | Eldridge et al. | |
| 2014/0236506 A1 | 8/2014 | Nikovski et al. | |
| 2014/0330955 A1 | 11/2014 | Bishop et al. | |
| 2014/0337429 A1 | 11/2014 | Asenjo et al. | |
| 2014/0358839 A1 | 12/2014 | Dhurandhar et al. | |
| 2014/0379303 A1 | 12/2014 | Chandrashekaraiah et al. | |
| 2015/0052088 A1 | 2/2015 | Arya et al. | |
| 2015/0103672 A1 | 4/2015 | Stuart | |
| 2015/0241482 A1 | 8/2015 | Sonderegger | |
| 2015/0241488 A1 | 8/2015 | Sonderegger | |
| 2015/0280782 A1 | 10/2015 | Airbinger et al. | |
| 2016/0109491 A1* | 4/2016 | Kann | G01R 19/2506 702/64 |
| 2016/0109497 A1 | 4/2016 | Aiello et al. | |
| 2016/0142514 A1 | 5/2016 | Stuber et al. | |
| 2016/0154040 A1 | 6/2016 | Driscoll et al. | |
| 2016/0173237 A1 | 6/2016 | Braun et al. | |
| 2016/0352103 A1 | 12/2016 | Aiello et al. | |
| 2018/0156851 A1 | 6/2018 | Driscoll et al. | |
| 2018/0213304 A1 | 7/2018 | Van Wyk | |

FOREIGN PATENT DOCUMENTS

| | | |
|---|---|---|
| EP | 1460801 | 9/2004 |
| GB | 2426596 | 11/2006 |
| JP | 06273200 | 9/1994 |
| JP | 2000175358 | 6/2000 |
| JP | 2000249730 | 9/2000 |
| JP | 2004340767 | 12/2004 |
| JP | 2012016270 | 1/2012 |
| JP | 2012058233 | 3/2012 |
| JP | 2012521596 | 9/2012 |
| JP | 2014079138 | 5/2014 |
| JP | 2015076994 | 4/2015 |
| JP | 2015107012 | 6/2015 |
| WO | WO2007063180 | 6/2007 |
| WO | WO2009061291 | 5/2009 |
| WO | WO2010105038 | 9/2010 |
| WO | WO2010110787 | 9/2010 |
| WO | WO2014124318 | 8/2014 |

OTHER PUBLICATIONS

Berthier et al., "Intrusion detection for advanced metering infrastructures: Requirements and architectural directions", In Smart Grid Communications (SmartGridComm), 2010 First IEEE International Conference on Oct. 4, 2010, pp. 350-355.

Do, et al., "Open-Source Testing Tools for Smart Grid Communication Network", 2013 IEEE Conference on Open Systems (ICOS), Dec. 2, 2013, pp. 156-161, retrieved on Feb. 7, 2014.

Extended European Search Report dated Sep. 6, 2012 for European patent application No. 12165026.1, 6 pages.

(56) References Cited

OTHER PUBLICATIONS

Final Office action for U.S. Appl. No. 13/560,078, dated Feb. 24, 2017, Hartman et al., "Automatic Network Topology Detection and Fraud Detection", 33 pages.
Handley, et al., "ComEd Corrects Meter-Transformer Mismatches" ComEd Paper, Sep. 7, 2016, 8 pages.
"Health Device Profile", Medical Devices WG, Internet citation, Jun. 26, 2008, pp. 1-44, retrieved from the internet on Nov. 9, 2015 at URL:https://www.bluetooth.org/docman/handlers/DownloadDoc.ashx?doc_id=260864&vId=290095&_ga=1.128761092.961309788.1447059724.
Hughes, "Augmenting AMI to Radically Reduce Electricity Theft", Metering International, Issue 1, Jan. 1, 2011, pp. 80-83, retrieved from the internet on May 20, 2015 at http://www.metering.com/wp-content/uploads/2013/10/MI-1-2-11.pdf.
Japanese Office Action dated Oct. 28, 2014 for Japanese patent application No. 2014-511377, a counterpart foreign application of U.S. Appl. No. 13/560,078, 5 pages.
Japanese Office Action dated Apr. 22, 2014 for Japanese patent application No. 2014-511377, a counterpart foreign application of U.S. Appl. No. 13/560,078, 6 pages.
Madden, et al., "TinyDB: An Acquisitional Query Processing System for Sensor Networks", ACM Transactions on Database Systems, vol. 30, No. 1, Mar. 1, 2005, pp. 122-173.
Maqousi, et al., "Towards an Open Architecture for Smart Grid Communications: Possible Pointers from Multiservice Network Research", 2013 1st International Conference & Exhibition on the Applications of Information Technology to Renewable Energy Processes and Systems, IEEE, May 29, 2013, pp. 114-118, retrieved on Aug. 29, 2013.
Moritz et al., "A CoAP based SOAP Transport Binding", IEEE Conference on Emerging Technologies and Factory Automation (ETFA'2011), Sep. 2011, 4 pages.
Office action for U.S. Appl. No. 13/560,078, dated Oct. 2, 2015, Van Wyk, "Automatic Network Topology Detection and Fraud Detection", 29 pages.
Final Office Action for U.S. Appl. No. 13/560,078, dated Oct. 6, 2014, Hartman Van Wyk, "Automatic Network Topology Detection and Fraud Detection", 34 pages.
Office action for U.S. Appl. No. 13/560,078, dated Dec. 16, 2013, Van Wyk, "Automatic Network Topology Detection and Fraud Detection", 23 pages.
Office Action for U.S. Appl. No. 13/560,078, dated Feb. 13, 2015, Hartman Van Wyk, "Automatic Network Topology Detection and Fraud Detection", 22 pages.
Office action for U.S. Appl. No. 14/280,286, dated Feb. 16, 2016, Sonderegger, "Smart Grid Topology Estimator", 19 pages.
Office action for U.S. Appl. No. 14/280,286, dated Mar. 17, 2017, Sonderegger, "Smart Grid Topology Estimator", 13 pages.
Office action for U.S. Appl. No. 14/558,571, dated Mar. 9, 2017, Driscoll, "Electrical Network Topology Determination", 15 pages.
Final Office Action for U.S. Appl. No. 13/560,078, dated Jul. 1, 2015, Hartman Van Wyk, "Automatic Network Topology Detection and Fraud Detection", 23 pages.
Office action for U.S. Appl. No. 14/547,561, dated Jul. 29, 2016, Stuber, "Application Platform Operable on Network Node", 33 pages.
Office action for U.S. Appl. No. 13/560,078, dated Aug. 15, 2013, Van Wyk, "Automatic Network Topology Detection and Fraud Detection", 16 pages.
Final Office Action for U.S. Appl. No. 14/280,286, dated Aug. 4, 2016, Robert Sonderegger, "Smart Grid Topology Estimator", 20 pages.
"Open Smart Grid Protocol (OSGP); draft ETSI GS OSG 001", European Telecommunications Standards Institute (ETSI), France, vol. zArchive—ISG, No. VO.1.2, Nov. 15, 2011, pp. 1-250, retrieved on Nov. 15, 2011.
PCT Search Report and Written Opinion dated Jan. 28, 2016 for PCT application No. PCT/US2015/056482, 10 pages.

PCT Search Report dated Jan. 31, 2013 for PCT application No. PCT/US12/34697, 9 pages.
PCT Search Report and Written Opinion dated Oct. 20, 2015 for PCT Application No. PCT/US15/44191, 11 pages.
PCT Search Report and Written Opinion dated Feb. 18, 2016 for PCT application No. PCT/US20165/063512, 13 page.
PCT Search Report and Written Opinion dated Mar. 2, 2016 for PCT application No. PCT/US2015/061390, 15 pages.
PCT Search Report and Written Opinion dated May 22, 2015 for PCT application No. PCT/US2015/017571, 9 pages.
PCT Search Report and Written Opinion dated Jun. 1, 2015 for PCT Application No. PCT/US2015/017575.
PCT Search Report and Written Opinion dated Jul. 7, 2016 for PCT application No. PCT/US2016/030144, 12 pages.
Regehr et al.,"TinyOS 2.1 Adding Threads and Memory Protection to TinyOS", proceedings of the 6th ACM conference on Embedding Network Sensor Systems (SenSys'08), Apr. 2008, 2 pages.
Sharon, et al., Topology Identification in Distribution Network with Limited Measurements, Inovative Smart Grid Technology Conference, Jan. 16-20, 2012, IEEE, pp. 1-6.
Short, "Advanced Metering for Phase Identification, Transformer Identification, and Secondary Modeling", IEEE Transactions on Smart Grid, IEEE, USA, vol. 4, No. 2, Jun. 1, 2013, pp. 651-658.
Snell, "Call SOAP Web services with Ajax Part 1: Build the Web services client", IBM Corporation developerWorks, Oct. 2005, 13 pages.
Australian Office Action dated Aug. 23, 2017 for Australian Patent Application No. 2015223053, a counterpart foreign application of U.S. Appl. No. 14/302,617, 10 pages.
Japanese Office Action dated Aug. 29, 2017 for Japanese Patent Application No. 2016-553886, a counterpart foreign application of U.S. Appl. No. 14/302,617.
Japanese Office Action dated Sep. 12, 2017 for Japanese patent application No. 2016-553860, a counterpart foreign application of U.S. Appl. No. 14/280,286.
Keisuke Sugiura, Mitsubishi Electric Research Laboratories, Information Processing Society of Japan, 2013, pp. 4-513-4-514.
Office action for U.S. Appl. No. 14/280,286, dated Aug. 11, 2017, Sonderegger, "Smart Grid Topology Estimator", 15 pages.
Canadian Office Action dated Oct. 26, 2016 for Canadian patent applicatoin No. 2863596, a counterpart foreign application of U.S. Appl. No. 13/560,078, 3 pages.
Office action for U.S. Appl. No. 13/560,078, dated Feb. 24, 2017, Van Wyk, "Automatic Network Topology Detection and Fraud Detection", 32 pages.
Office Action for U.S. Appl. No. 14/518,564, dated Jul. 20, 2017, Kann, "Grid Topology Mapping With Voltage Data", 18 pages.
Translated Japanese Office Action dated Oct. 28, 2014 for Japanese patent application No. 2014-511377, a counterpart foreign application of U.S. Appl. No. 13/560,078, 5 pages.
Translated Japanese Office Action dated Apr. 22, 2014 for Japanese patent application No. 2014-511377, a counterpart foreign application of U.S. Appl. No. 13/560,078, 6 pages.
Australian Examination Report dated Apr. 28, 2016, for Australian Patent Application No. 2012377368, a counterpart application of U.S. Appl. No. 13/560,078,3 pages.
Australian Office Action dated Jan. 10, 2018 for Australian patent application No. 2015349942, a counterpart foreign application of U.S. Appl. No. 9,781,231, 3 pages.
Australian Office Action dated Jan. 5, 2018 for Australian Patent Application No. 2017202822, a counterpart foreign application of U.S. Appl. No. 13/560,078, 3 pages.
Australian Office Action dated Nov. 24, 2017 for Australian Patent Application No. 2015358521, a counterpart foreign application of U.S. Appl. No. 14/558,571, 3 pages.
Australian Office Action dated Dec. 15, 2017 for Australian Patent Application No. 2015336081, a counterpart foreign application of U.S. Pat. No. 9,568,522, 3 pages.
Australian Office Action dated Feb. 26, 2018 for Australian Patent Application No. 2015223145, a counterpart foreign application of U.S. Appl. No. 14/280,286, 3 pages.

(56) References Cited

OTHER PUBLICATIONS

Australian Office Action dated Feb. 6, 2018 for Australian patent application No. 2015337110, a counterpart foreign application of U.S. Appl. No. 14/518,564, 3 pages.

Canadian Office Action dated Feb. 26, 2018 for Canadian patent application No. 2965101, a counterpart foreign application of U.S. Appl. No. 14/518,564, 3 pages.

Communication pursuant to Article 94(3) EPC dated Jul. 29, 2016, for EP Application No. 12165026.1, a counterpart application of U.S. Appl. No. 13/560,078, 6 pages.

Office Action for U.S. Appl. No. 14/302,617, dated Jan. 5, 2018, Sonderegger, "Detection of Electric Power Diversion", 29 pages.

Office Action for U.S. Appl. No. 14/518,564, dated Dec. 7, 2017, Kann, "Grid Topology Mapping With Voltage Data", 19 pages.

Office action for U.S. Appl. No. 14/280,286, dated Feb. 1, 2018, Sonderegger, "Smart Grid Topology Estimator", 20 pages.

Australian Office Action dated May 17, 2018 for Australian Patent Application No. 2017202822, a counterpart foreign application of U.S. Appl. No. 13/560,078, 2 pages.

Australian Office Action dated Jun. 15, 2018 for Australian Patent Application No. 2016266732, a counterpart foreign application of U.S. Appl. No. 15/058,112, 3 pages.

Canadian Office Action dated Apr. 9, 2018 for Canadian patent application No. 2969685, a counterpart foreign application of U.S. Pat. No. 9,835,662, 4 pages.

Japanese Office Action dated Apr. 24, 2018 for Japanese Patent Application No. 2016-553860, a counterpart foreign application of U.S. Appl. No. 14/280,286.

Japanese Office Action dated Apr. 3, 2018 for Japanese Patent Application No. 2016-553886, a counterpart foreign application of U.S. Appl. No. 14/302,617.

Office Action for U.S. Appl. No. 15/058,112, dated Mar. 29, 2018, Aiello, "Automatic Network Device Electrical Phase Identification", 14 pages.

\* cited by examiner

FIG. 8

ELECTRICAL PHASE IDENTIFICATION

RELATED APPLICATIONS

This application is a continuation of U.S. patent application Ser. No. 14/531,845, filed on Nov. 3, 2014, which claims the benefit of U.S. Provisional Application No. 62/066,248, filed on Oct. 20, 2014, both of which are incorporated by reference herein in their entirety.

BACKGROUND

Phase identification is a process of discovering and recording the phase, e.g., from among the phases of three-phase electrical power, to which devices in an electrical distribution network are connected. Knowledge of phase use is important to an electric utility, and assists with functions such as load balancing, power distribution efficiency, smart grid analytics and others. Accordingly, a thorough knowledge of the topology of an electrical network, including knowledge of a phase to which electric meters, transformers and other devices are connected, is important for electrical grid operation.

Manual inspection may be performed to identify phase use by network devices. According to such techniques, electric meters may be inspected at their actual location, and their supply lines followed to the substation. Surveyors may thereby understand network topology and device phase use. However, difficulties in accurately following lines and the expense of such methods prevent their widespread use.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. Moreover, the figures are intended to illustrate general concepts, and not to indicate required and/or necessary elements.

DETAILED DESCRIPTION

Overview

Techniques to identify aspects of electrical distribution network topology in an automated manner, including electrical phases used by individual network devices, are presented. In an electrical distribution network, a feeder (the wiring from a substation to transformers) may have three conductors, each associated with one of the three phases of electrical power. The feeder may provide power to some transformers using one phase, and provide power to other transformers using different phases, etc. Meters measuring power from transformers are therefore associated with an electrical phase provided by the feeder. However, this relationship may not be adequately documented.

In one example method, an electric meter is selected from among a plurality of meters. The electrical meter selected may be a meter whose measured data will allow stronger correlation to a phase of a feeder than other meters' measured data. The selected meter may have recorded more energy consumption than other meters, or the energy measurement's derivative may have more strong peaks. In an example of energy changes and derivatives, data may be obtained that indicates energy or power measured over time by a meter and/or energy or power transmitted over time by each phase of a feeder line. This data may be processed to describe changes in energy or changes in power over time. Depending on the techniques used, the changes over time may be a derivative, and the process by which the changes are calculated may be differentiation. Accordingly, energy measured and/or recorded by the meter may be differentiated or otherwise processed to obtain changes in energy over time at the meter. Energy transmitted and/or provided by each phase of a feeder may also be differentiated or otherwise processed to obtain changes in energy over time at each phase of the feeder. The changes in energy of the selected meter may be correlated and/or compared to the changes in energy of the feeder, for each of a plurality of electrical phases. The correlation process may provide different correlation values of the meter to each phase of the feeder. Since the energy used by the selected meter is provided by one of the phases of the feeder, a better correlation is likely between the meter and that phase. Accordingly, a phase to which the meter is believed to be connected is determined, based at least in part on the comparisons and/or correlations. Data indicating quantities of energy measured by the meter over periods of time may be subtracted from data records of energy transmitted by the selected phase of the feeder over the same periods. Following the subtraction, the derivative or changes in energy of that phase of the feeder may be recalculated. The process may be repeated for additional meters.

Example Electrical Distribution Grid

Figure 1:
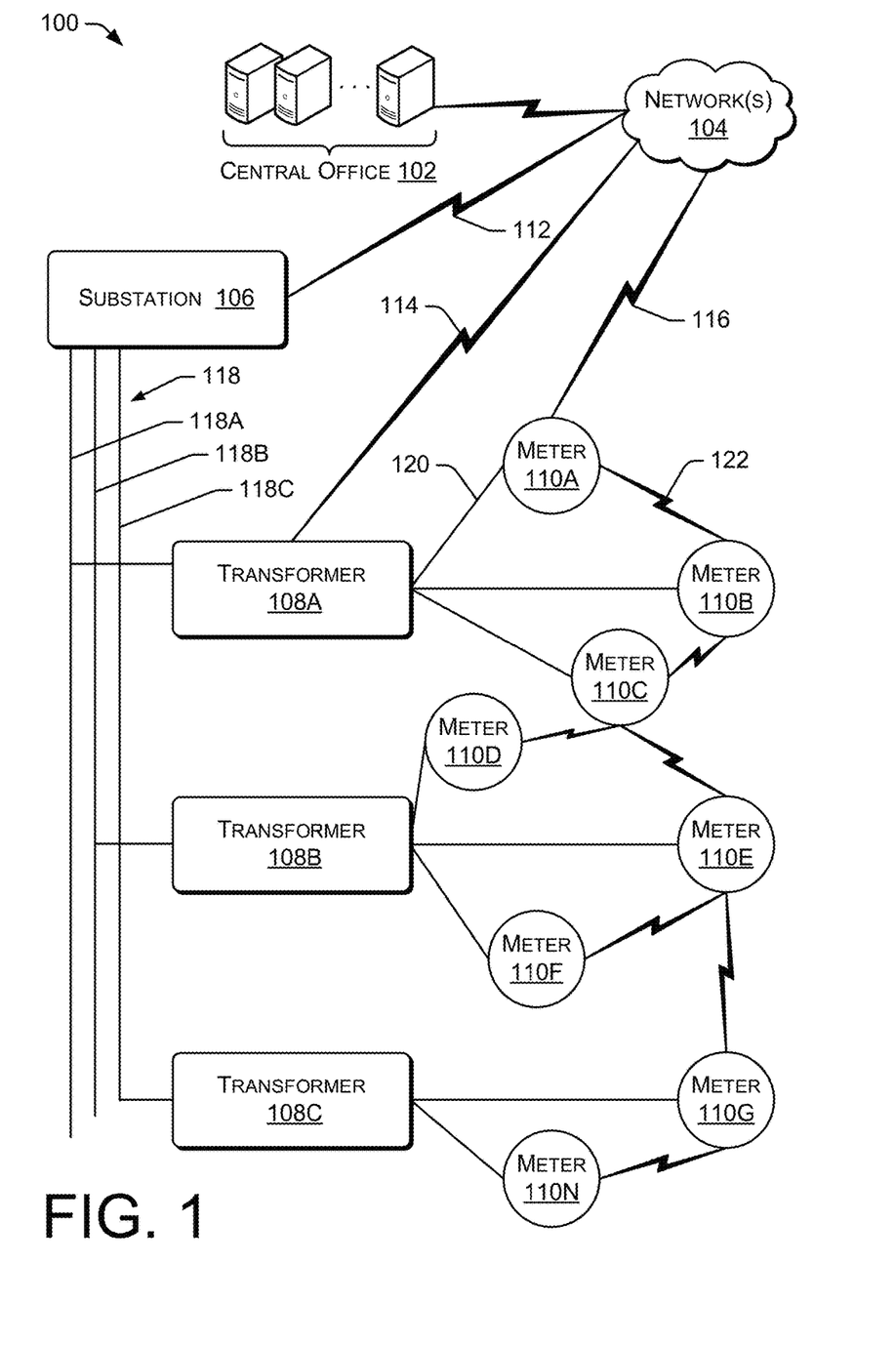
FIG. 1 is schematic diagram showing an example electrical network employing techniques to identify aspects of network topology including electrical phase use by network components.

FIG. 1 shows an example electrical network 100 configured to identify aspects of network topology including electrical phase use by network components. In the example electrical network 100, a central office 102 may be configured to perform this functionality. In other example networks, one or more other network device(s) may perform all or part of the calculations that determine aspects of the electrical grid topology and/or the phase use of particular devices.

The central office 102 may include one or more servers or other computing devices, and may be associated with an electrical utility company or service organization. The central office 102 may utilize one or more networks 104, such as the Internet or proprietary network(s) and/or connection(s), to communicate with one or more network devices. In the example shown, the central office 102 may communicate with a substation 106, one or more transformers 108 and/or a plurality of meters 110, such as by use of wired or wireless communication links 112, 114 and 116.

The substation 106 measures and provides power to one or more feeder lines, which in turn provide power to transformers serving other network devices. In the example shown, a three-phase transmission line 118 includes phases 118A, 118B and 118C. For purposes of example, the phase lines 118A, B and C each provide power to one transformer, i.e., transformers 108A, 108B and 108C. Each transformer provides power over wiring 120 to each of a plurality of meters 110. In particular, transformer 108A provides power obtained from phase A and conductor 118A to meters 110A, 110B and 110C. Similarly, transformer 108B provides power obtained from phase B and conductor 118B to meters 110D, 110E and 110F. Also, transformer 108C provides power obtained from phase C and conductor 118C to meters 110G and 110N.

The meters 110 may be connected for communication by a wired or wireless network. The communication may be one- or two-way, and may allow electrical meters 110 to report consumption data to the central office 102. In the example shown, RF links 122 provide a mesh network that allows two-way communication between the central office 102 and meters 110.

Example Electrical Energy and Changes in Energy

Figure 2:
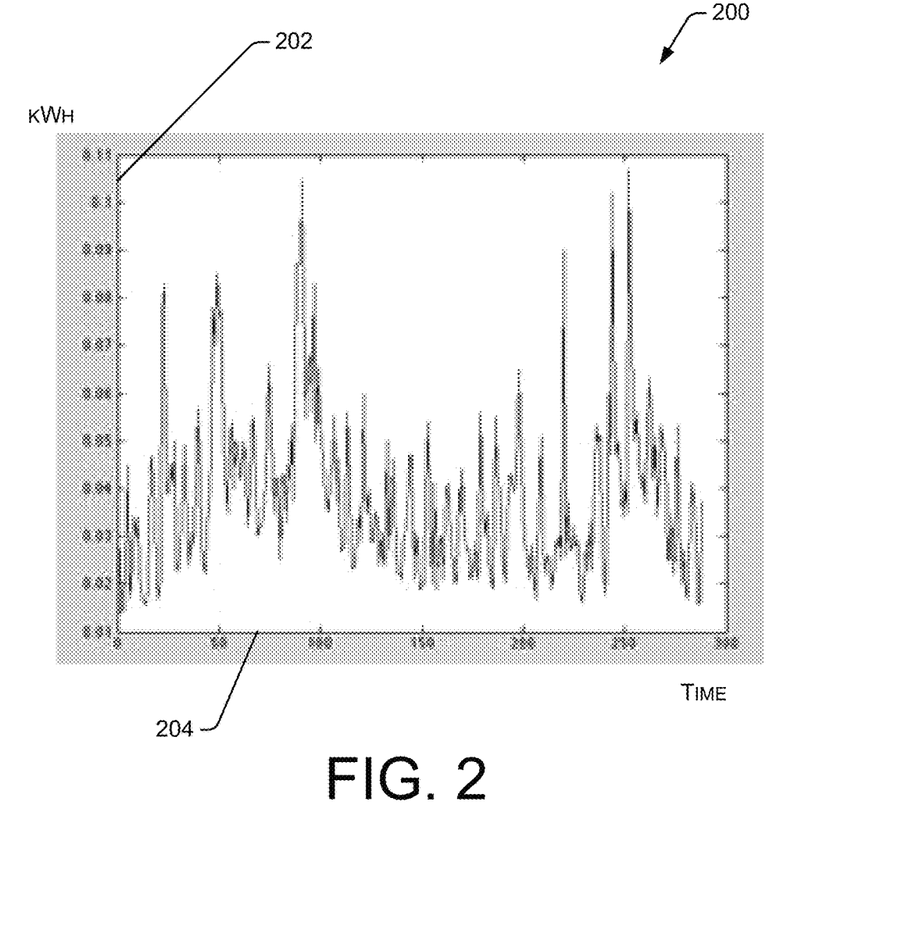
FIG. 2 is graph showing example energy consumption at an electrical meter, wherein the vertical axis represents kWh and the horizontal axis represents time.

FIG. 2 shows example energy consumption data 200 obtained from an electrical meter, such as one meter 110A of FIG. 1. The vertical axis 202 shows energy (e.g., kilowatts hours) and the horizontal axis 204 shows time. Thus, data 200 represents the energy consumption by a customer recorded at a meter over interval(s) of time.

Figure 3:
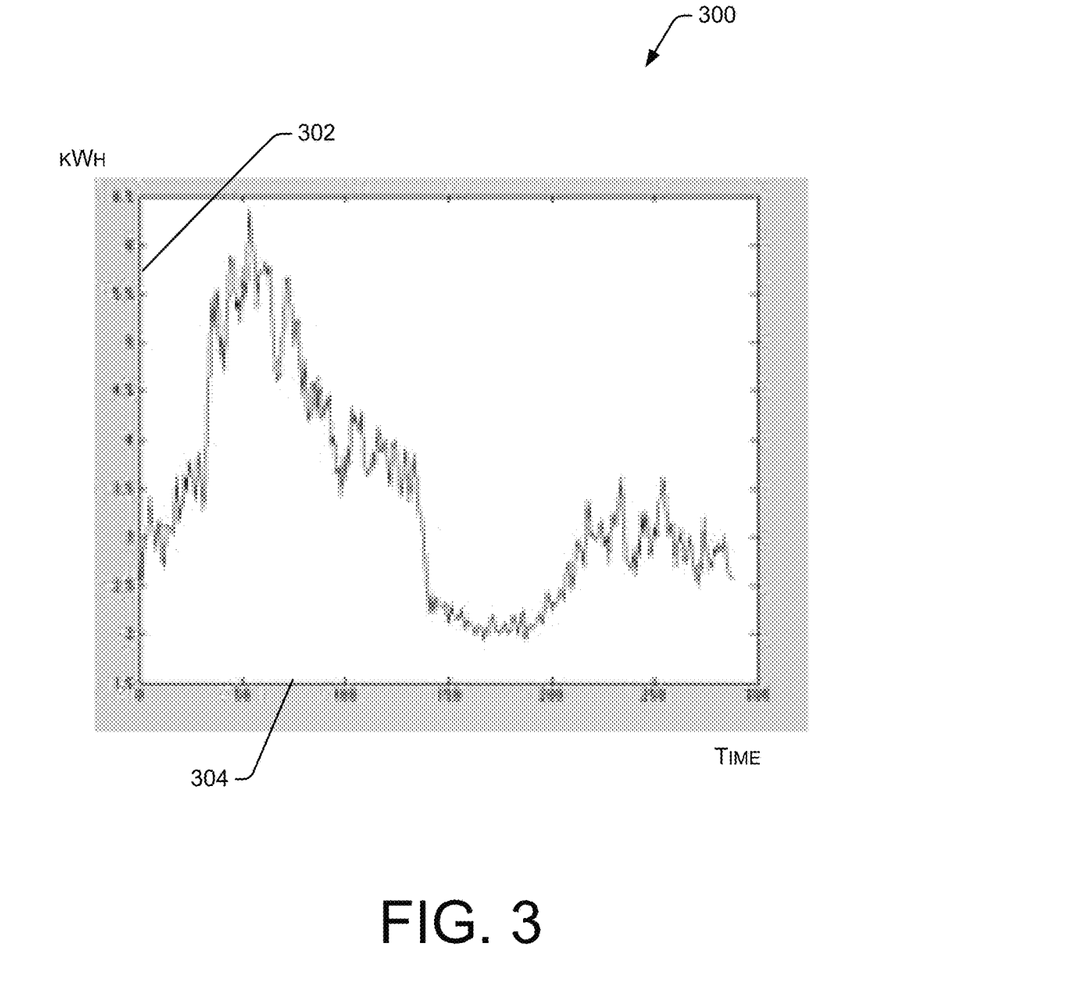
FIG. 3 is a graph showing example energy distributed by an electrical feeder line measured at the substation, wherein the vertical axis represents kWh and the horizontal axis represents time.

FIG. 3 shows example energy-distribution data 300 associated with a phase of an electrical feeder line, such as phase 118A the feeder line 118 of FIG. 1. The vertical axis 302 shows energy transmission (e.g., kilowatts hours) and the horizontal axis 304 shows time. Thus, data 300 represents the energy transmission of one phase of the feeder over interval(s) of time, and may have been measured at the substation 106 of FIG. 1.

The consumption data 200 and transmission data 300 may be used as inputs to a system configured to identify aspects of network topology including electrical phase use by network devices. The consumption data 200 and transmission data 300 may be gathered over a period of time (e.g., 90 days) and may be taken at intervals (e.g., 5-, 10-, 15- or 30-minutes, or other interval). Thus, the intervals represent energy or power used during that interval, and the period of time indicates the period over which interval data was obtained. The period of time over which the data is measured/recorded and the duration of each interval may be selected according to the constraints (e.g., cost or network capacity) imposed by a particular investigation of an electrical distribution grid. However, for many applications, 90 days of data taken at intervals of 15 minutes is satisfactory.

Figure 4:
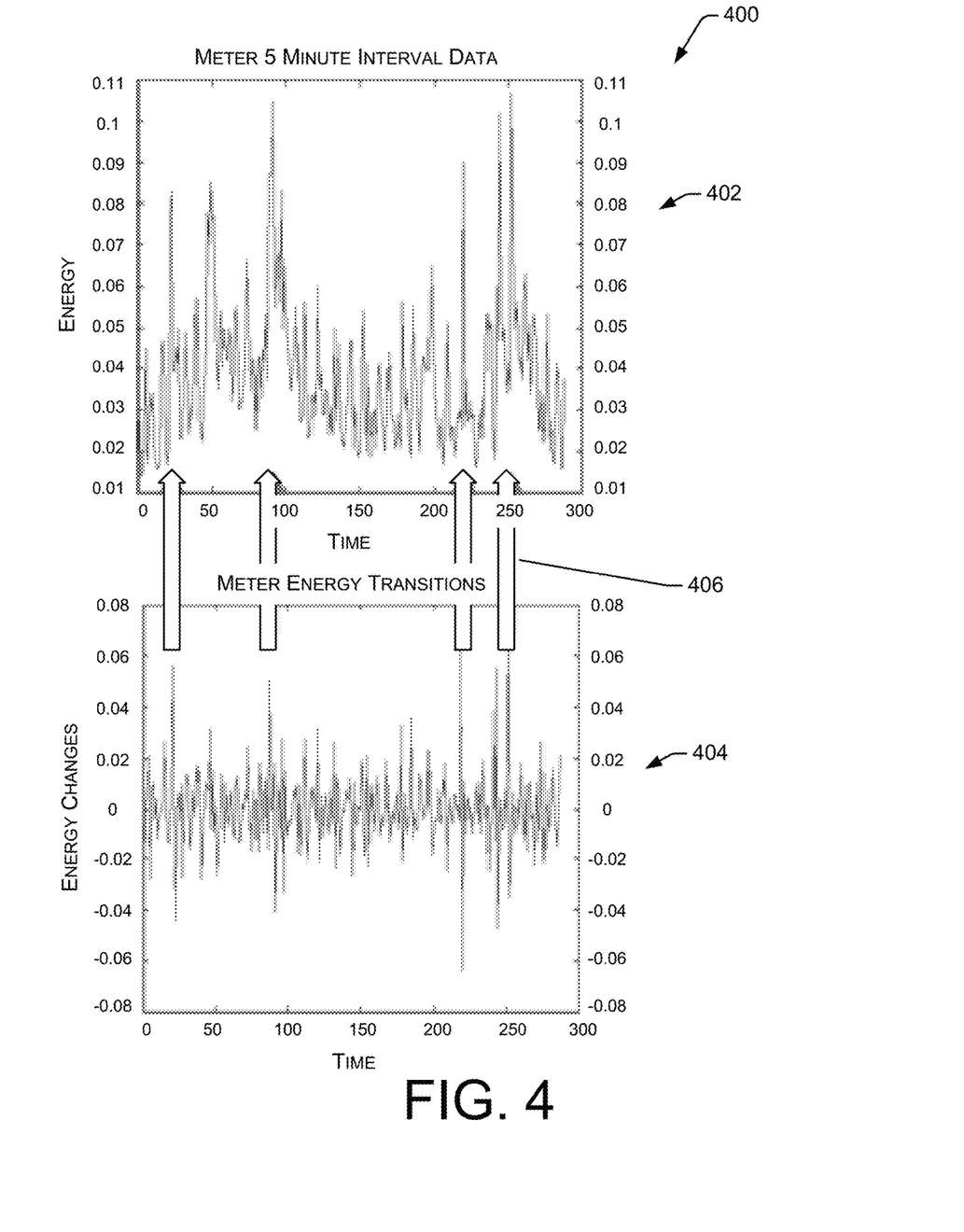
FIG. 4 is graph showing an example relationship between measured electrical energy consumption at a meter (top graph) and changes in electrical energy used (bottom graph).

FIG. 4 shows an example relationship 400 between measured electrical energy consumption at a meter and changes in electrical energy. An upper graph 402 shows example energy measured at a meter (e.g., meter 110A of FIG. 1). Energy use is shown on the vertical axis and time is shown on the horizontal axis. Energy use is always positive, in the graph 402, but could be zero (e.g., if service was turned off to a customer). Thus, the graph 402 shows that different amounts of energy are measured at different times.

A lower graph 404 shows energy changes on the vertical axis and time on the horizontal axis. Thus, while the upper graph 402 shows energy, the lower graph 404 shows changes in energy. Energy use may correspond to energy used by appliances. Changes in energy use may correspond to appliances being turned on and off at a specific time. Energy changes are sometimes positive (e.g., when energy use increases, such as an appliance turning on) and sometime negative (e.g., when the appliance turns off).

A relationship between energy use over time (graph 402) and energy change over time (graph 404) may be seen by reference to arrows 406. In particular, arrows 406 show that spikes in energy change (graph 404) correspond to changes in energy consumption (graph 404). Thus, graph 402 shows a function of energy use over time, and graph 404, showing energy change, is the derivative or differential (e.g. of a discrete function) of that energy use over time.

Example Computing System for Grid Topology and Phase Discovery

Figure 5:
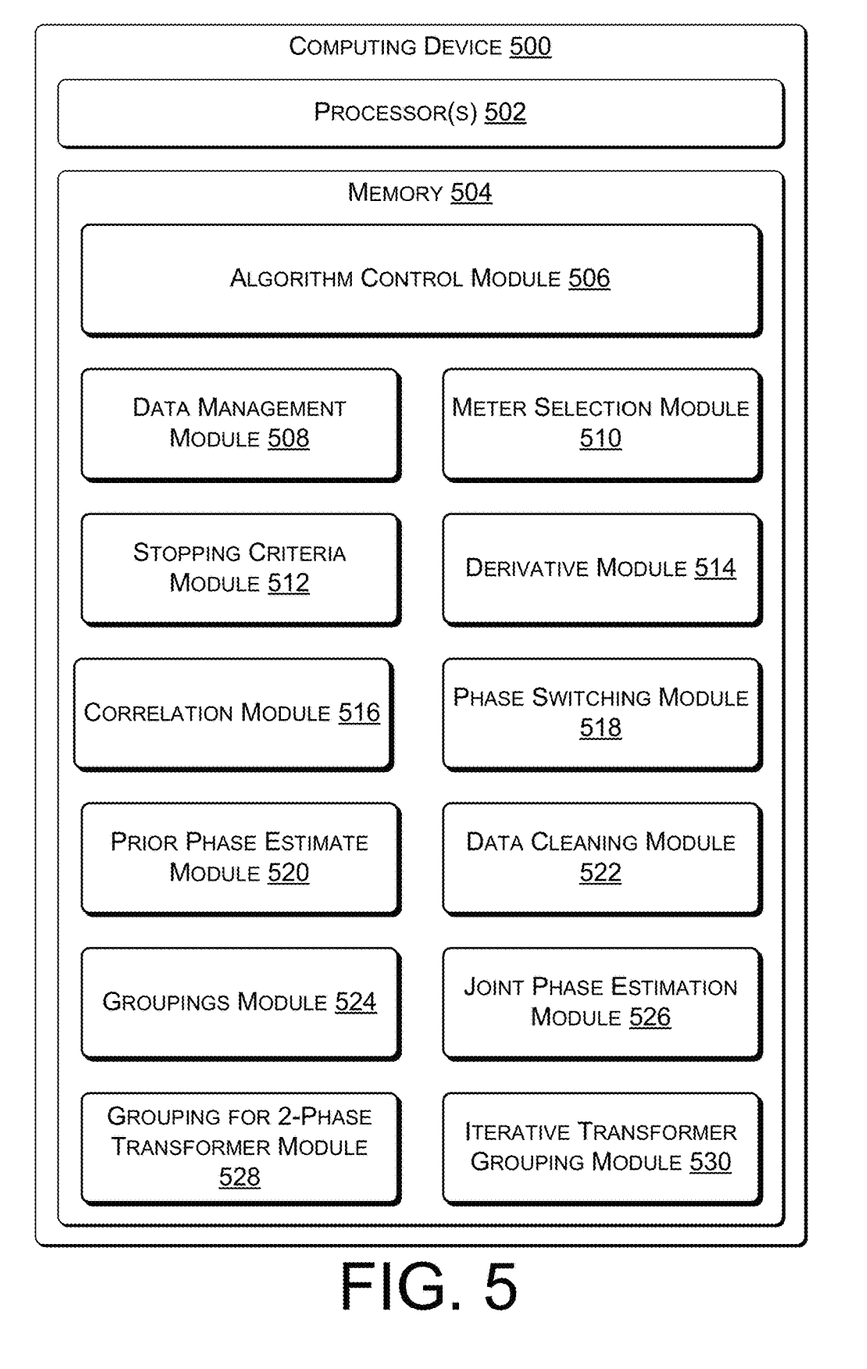
FIG. 5 is a block diagram showing an example structure of a computing device configured to identify aspects of network topology including electrical phase use by network components.

FIG. 5 is a block diagram showing an example structure of a computing device 500 configured to identify aspects of network topology including electrical phase use by individual network components (e.g., transformers and electrical meters). In one example, the computing device 500 is located within the central office 102. In other examples, the computing device is located in alternative locations. In the example shown, the computing device 500 is monolithic in design. However, in other examples, elements of the computing device 500 and/or its functionality may be distributed over two or more devices.

A processor 502 may be in communication with memory 504. The processor 502 may include one or more processors, which may be general purpose or specifically purposed, such as application specific integrated circuits (ASICs). The memory 504 may include one or more modules, which may be configured as processor-executable instructions such as subroutines, procedures and/or functions, etc. While example modules are shown, the segregation of particular functional aspects into particular modules is for purposes of example only. Accordingly, other, different and/or alternative arrangements involving different modules and/or different groupings of functional elements within the same or different modules provide alternate embodiments of related innovations.

An algorithm control module 506 may be configured to control techniques used to identify aspects of electrical distribution network topology in an automated manner and to identify electrical phases used by individual network devices. In one example, the algorithm control module 506 may be configured to call or invoke one or more of the modules 508-530. In another example, the algorithm control module 506 may be configured to utilize one or more of the methods described in FIGS. 6-8. In still further examples, the algorithm control module 506 may be configured to utilize, call and/or coordinate other techniques as described herein or obvious in view of the description herein.

A data management module 508 may be configured to gather data describing energy and/or power transmitted by each of a plurality of electrical phases over a feeder and energy and/or power measured by each of a plurality of meters. FIGS. 2 and 3 show examples of data that is obtained by and/or managed by, the data management module 508. The data may include multiple days of data (e.g., 90 days)

and may include data entries for energy and/or power measured (e.g., by meter 110 of FIG. 1) and energy and/or power transmitted (e.g., by feeder line 118 of FIG. 1). The data management module 508 may also be configured to remove suspected-incorrect data from the gathered data, such as by calling data cleaning module 522.

A meter selection module 510 may be configured to select an electrical meter from among a plurality of meters. In the example of FIG. 1, the selection may be of an electrical meter from among meters 110A through 110N. Meter selections may be made in an iterative manner, in a process wherein the selected meter is associated with one of the three electrical phases and a further meter is selected. In one example, the electrical meter selected may be the strongest meter from among a plurality of meters, and may be the meter with the highest confidence of correlation with a particular electrical phase. The strongest meter may be selected through use of criteria, such as having the most peaks over a threshold size or magnitude (in a derivative or other change function, etc.), within a prescribed period of time. Other possible selection characteristics include having more accumulated energy (e.g., more measured kilowatt hours) than other meters. Other structured or non structured data can be utilized to aid in the selection. Referring to FIG. 4, example derivative peaks are shown in graph 404. A meter with a larger number of such peaks, particularly peaks over a threshold magnitude, may be selected. Additionally or alternatively, the meter may be selected based at least in part on a larger measure of accumulated energy (i.e., the meter measured more kilowatt hours) than others of the plurality of meters.

A stopping criteria module 512 may be used to determine when a plurality of meters does not contain a meter that can be correlated with an electrical phase with a threshold degree of certainty. When correlation is below a threshold, the association of the meter with an electrical phase may be incorrect. Such incorrect associations may introduce noise into the feeder data (e.g., subtraction of meter data from incorrect feeder phase values). In one example of the stopping criteria module 512, a stopping criteria is indicated when the strongest meter available for selection has less than a first threshold number of derivative peaks above a second threshold magnitude. In another example, the stopping criteria may be triggered when all meters have registered less than a threshold number of kilowatt hours over a period of time. A third example is a hybrid of the first two examples. Exact stopping criteria may be selected based on particular network circumstances.

A derivative module 514 may be configured to input data indicting energy or power measured over time by a meter and/or energy and/or power transmitted over time by each phase of a feeder line. The derivative module 514 may output data describing changes in energy or power over time, which in some applications is a derivative. Accordingly, the changes in energy or power over time may be called a derivative, and the process by which the changes are calculated may be called differentiation. Accordingly, energy and/or power use over time may be input to the derivative module 514, and change in energy and/or power use may be output. In one example, the derivative module 514 may be configured to determine energy changes with respect to time of energy transmitted by each of the plurality of electrical phases of the feeder and energy changes with respect to time of energy measured by each of the plurality of meters. In a further example, the derivative module 512 may take a derivative of an input energy and/or power over time function to thereby create an output energy and/or power change over time function. Referring to the example of FIG. 4, energy measured by a meter is seen in graph 402, and the energy change function or derivative is seen in the graph 404. The derivative module 514 may take a derivative at a point, or may take the derivative over a plurality of ranges in time.

A correlation module 516 may determine a best correlation between the derivative of the consumption data measured at a meter and the derivative of the feeder data for each electrical phase. That is, correlation values are found for the changes in measured consumption data at the meter and the changes in the measured supply data at each electrical phase (A, B and C) of the feeder line. Because the meter is being supplied by one of the phases, that phase may correlate better than the other two phases. In the first example, an entire sequence (e.g., 90 days) of meter power change data is correlated at once to an entire sequence of feeder phase power change data. A different example involves correlating day-by-day and adding up the 90 correlations. While correlating one day at a time allows observation of possible improvement and convergence of the probability of correct detection, the boundary time period between days is not being used to compute the derivative and information is lost. In one example, the correlation module 516 may be configured to select a phase to which a meter from among a plurality of meters is associated based at least in part on correlation of energy changes with respect to time of power transmitted by each electrical phase of a feeder with respect to energy changes with respect to time of power measured by one or more meters.

A phase switching module 518 may be configured to recognize phase switching by a meter during the data collection period, such as by comparing a plurality of different confidence measures within a period of data collection. In some instances, the data collection period may be sufficiently long that some meters may switch phases (i.e., become connected to a different phase) during that period. In some instances, the phase switch may be performed by automated equipment. In other instances, the phase switch may be performed by service crews.

In an example of phase switching, a meter may belong to the following phases during five time periods, while data is being collected:

A, B, B, B, A

The sequence indicates that the meter is on phase A and has switched two times. Without application of the phase switching module 518, an algorithm might decide that the meter belongs to phase B, due to majority rule.

However, if a confidence measure is defined for a short correlation time period, this measure can be used to accumulate correlations over an increasing window until a confidence criteria is reached. For example, within a 90-day interval correlations may be computed $c_i$ for i=1, 2, 3 is the phase for the $90^{th}$ day only. Let $$i' = \arg[\max_i c_i]$$

Then if $c_{i'}$ is greater than $c_i$ for i not equal to i' by a predefined threshold $c_{diff}$, then continued computing and accumulating of the correlations for the $89^{th}$ day, $88^{th}$ day, and so on, is not required. If $c_{i'}$ is not greater than $c_i$ for i not equal to i' by a predefined threshold $c_{diff}$, then there is not enough confidence to make a phase estimate. In this circumstance, the window may be enlarged by including the 89$^{th}$ day and the correlations computed for the 89$^{th}$ and 90$^{th}$ together. The window size (i.e., how many days may be included) may be guided by the probability of phase switching if that is known.

In one example of operation, the phase switching module 518 may, when comparing the electrical change values of each phase of the feeder to electrical change values for the meter, compare the electrical change values of each phase of the feeder to electrical change values for the meter using data of less than a threshold age. However, if data of less than the threshold age failed to provide a predetermined confidence level of correlation then the electrical change values of each phase of the feeder may be compared to electrical change values for the meter without regard to the threshold age.

A prior phase estimate module 520 may be configured to remove known-phase (or estimated known-phase) meters from among the plurality of meters. That is, if data exists that associates a particular meter with a particular electrical phase, that meter may be removed from the group of meters that have not yet been assigned to a phase. Thus, the prior phase estimate module 520 may be configured to remove or subtract data related to energy and/or power measured by meters of known phase from the data associated with particular phases of the feeder. Such removals of known-phase meters, from a plurality of meters, may be performed before meters are selected from among the plurality of meters. The removals may be performed when a confidence level of a phase to which each known-phase meter is associated exceeds a threshold. In one example, use of prior phase estimates (of "known" phase meters) may be based at least in part on a confidence level of a result obtained without using the prior estimates. That is, if a confidence of the prior estimate is higher than the confidence obtained without the prior estimate, it may be preferable to use the prior estimate. This may require processing known phase meters as described by FIGS. 6-8, to determine which confidence level is higher.

For example, if the prior estimates are more accurate than any estimate computed by the iterative algorithm described herein, the prior estimates could be used to remove of all such meters to derive the remaining feeder values for each phase. That is, the power associated with each removed meter may be subtracted from the feeder power. Specifically, for a meter j, the cross correlation may be computed as:

$$c_i^{(j)} = x\mathrm{corr}(d(m_j(t))/dt, d(f_i^{(j)}(t))/dt), i=1,2,3$$

where $$f_i^{(j)}(t) = f_i(t) - \mathrm{sum}(m^{(k)}(t))$$

with sum for all k not equal to j, and all meters m with prior phase estimates in i.

A data cleaning module 522 may be configured to remove or to set obtained energy values for the feeder, and obtained energy consumption values for a meter, to zero (or other appropriate value) if the values are believed to be incorrect. Such alterations of the data, such as setting portions of the data to zero, may be performed in a manner that does not introduce errors when a derivative is taken. In one example, if portions of the data associated with the meter and/or feeder are incorrect or invalid, they may be removed. In the example, setting the data to zero during those time periods may lead to improved performance. When setting the data to zero, boundaries (of time periods) may require attention to prevent the derivative or other related function from being artificially changed. This can be accomplished with windowing. In the example, meter values (consumption power values for particular time periods) may include $m_1, \ldots, m_5$ and feeder values (transmission power values for particular time periods) may include $f_1, \ldots, f_5$, while value $m_3$ may be thought to be invalid. Computing a derivative or slope $(m_4-m_2)/(\text{delta } t)$ can lead to misleading results. Such results may be avoided by instead cross correlating these two sequences:

$$s_1 = (m_2 - m_1, m_5 - m_4)$$

$$s_2 = (f_2 - f_1, f_5 - f_4)$$

$$c_1 = x\mathrm{corr}(s_1, s_2).$$

A groupings module 524 may be configured to utilize groupings of meters as part of a process to determine the strongest meters in the iterative algorithm or to determine transformer phase. In one example, the strongest transformer in a group of transformers may be identified by analyzing meter data, such as the energy measured by a plurality of meters and/or the derivative peaks seen in computed energy changes based on the measured data. The groupings module 524 may be called or invoked by the meter section module 510. In one example, the grouping module 524 may be configured for counting derivative peaks that exceed a threshold for each meter and grouping meters based at least in part on numbers of times the threshold was exceeded. In a second example, meters can be grouped by their total energy over a period of time. In a third example, meters can be grouped by the total number of derivative peaks above a threshold T. If a total number of derivative peaks above T is denoted by p, then:

$$p = \mathrm{count}(d(m(t))/dt > T).$$

In an example, several groupings may be defined as:

Very high grouping: $p > x_1$;

High grouping: $x_2 < p < x_1$;

Medium grouping: $x_3 < p < x_2$; and

Low grouping: $x_4 < p < x_3$.

In a third example, meters can be grouped by disjoint thresholds where there is at least one derivative peak above the threshold. That is, the threshold set may be defined as:

$$(T_1, T_2, T_3, \ldots, T_N).$$

And count values may be defined as:

$$p_{low} = \mathrm{count}(d(m(t))/dt > T_i)$$

$$p_{high} = \mathrm{count}(d(m(t))/dt > T_{i+1})$$

Then meter m belongs to bin i if $p_{low} > 0$ and $p_{high} = 0$.

In a fourth example, transformers can be grouped based on their total energy over a period of time. The total energy may be a sum of all meter energy measured by meters attached to that transformer.

In a fifth example, transformers can be grouped based on the total number of derivative peaks of their constituent meters. In some instances, it is possible that the strongest meters constitute the majority of the energy of a feeder. In the fourth and fifth examples, the groupings can be used to derive a confidence level of the phase estimate for the meters under a given transformer.

A joint phase estimation module 526 may be configured for a joint or unified estimation of the phase of meters under a single phase transformer. Preliminarily, all meters belonging to each single phase transformer are identified.

(1) For each single phase transformer, the meters may be grouped by their estimated electrical phase: A, B or C.

(2) For each group, statistics are determined. In a first example of the statistics, the total number of meters in each group where each meter has a certain number of derivative peaks above a certain threshold are counted (e.g., there may be 10 high meters in phase A, 6 in phase B, 3 in phase C). In a second example of the statistics, a count of derivative peaks is performed using various ranges, which may be associated with data bins (e.g., 4 very high meters in phase A, 3 high meters in phase A, 3 low meters in phase A, 5 high meters in phase B). In a third example of the statistics, count the total number of derivative peaks for all meters (e.g., 2000 total derivative peaks above a threshold for meters estimated to be in phase A, 1500 for meters estimated to be in phase B, etc.).

(3) The statistics may be used to derive a metric for each phase. For example, only the number of high meters may be used to make a comparison to determine the estimated phase. Or a weighted combination of the first and second examples may be used, whereby if there are no meters that are very high, high, or medium, and only low meters are left, only the largest number of derivative peaks that fall in each phase are considered, not just the number of meters with a low number of derivative peaks. Alternatively, extra weight can be given to a phase which has the largest number of derivative peaks, even if it does not have the largest number of meters.

(4) The best metric from (3), above, may be utilized to determine the phase for all meters under that transformer.

A grouping for 2-phase transformer module 528 may be configured for determining phases used by 2-phase transformers. For meters under a 2-phase transformer, a phase that a meter does not utilize may be known. In this case, if a transformer is connected to phase A and B, an estimate that a meter is connected to phase C is not correct. Accordingly, an algorithm may be used to revise the estimate of phase C to either phase A or phase B. An indication that more strong meters are associated with phase A than phase B does not indicate that the meter belongs to phase A. However, knowledge that the meter is not associated with phase C may be used during the iterative removal stage of the other algorithms discussed herein, as well as the transformer grouping iterative algorithm. Each revision, in this case to A or B, forks the algorithm. Confidence levels based on the correlation values for each possible revision could be used to prune the tree.

An iterative transformer grouping module 530 is configured to group meters with an appropriate phase using an associated transformer. Such an algorithm may consider and/or select the "highest" transformer instead of the highest meter. The highest transformer could be the transformer with the largest total energy over a period of time or the largest number of derivative peaks. Accordingly, instead of picking the highest meter (e.g., at block 602 of FIG. 6), the highest transformer is picked. An estimate of the phase of that transformer is made, including if it is single phase or 2-phase. Once estimated, energy measured by all meters under that transformer is subtracted from that estimated phase of the feeder. In one example, the transformer grouping module 530 may be configured to select a transformer based at least in part on total energy used by each of a plurality of transformers on a feeder, or based at least in part on a number and/or magnitude of changes in power or changes in energy associated with each transformer. In such an example, data gathered by the data management module 508 may additionally comprise power or energy used by transformers. Also, the derivative module 514 may additionally determine changes in power or energy at the transformers. And further, the correlation module 516 may determine a phase to which the meters connected to the selected transformer are connected.

Example Methods

In some examples of the techniques discusses herein, the methods of operation may be performed by one or more application specific integrated circuits (ASIC) or may be performed by a general purpose processor utilizing software defined in computer readable media. In the examples and techniques discussed herein, the memory 504 may comprise computer-readable media and may take the form of volatile memory, such as random access memory (RAM) and/or non-volatile memory, such as read only memory (ROM) or flash RAM. Computer-readable media devices include volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device.

As defined herein, computer-readable media does not include transitory media, such as modulated data signals and carrier waves, and/or signals.

Figure 6:
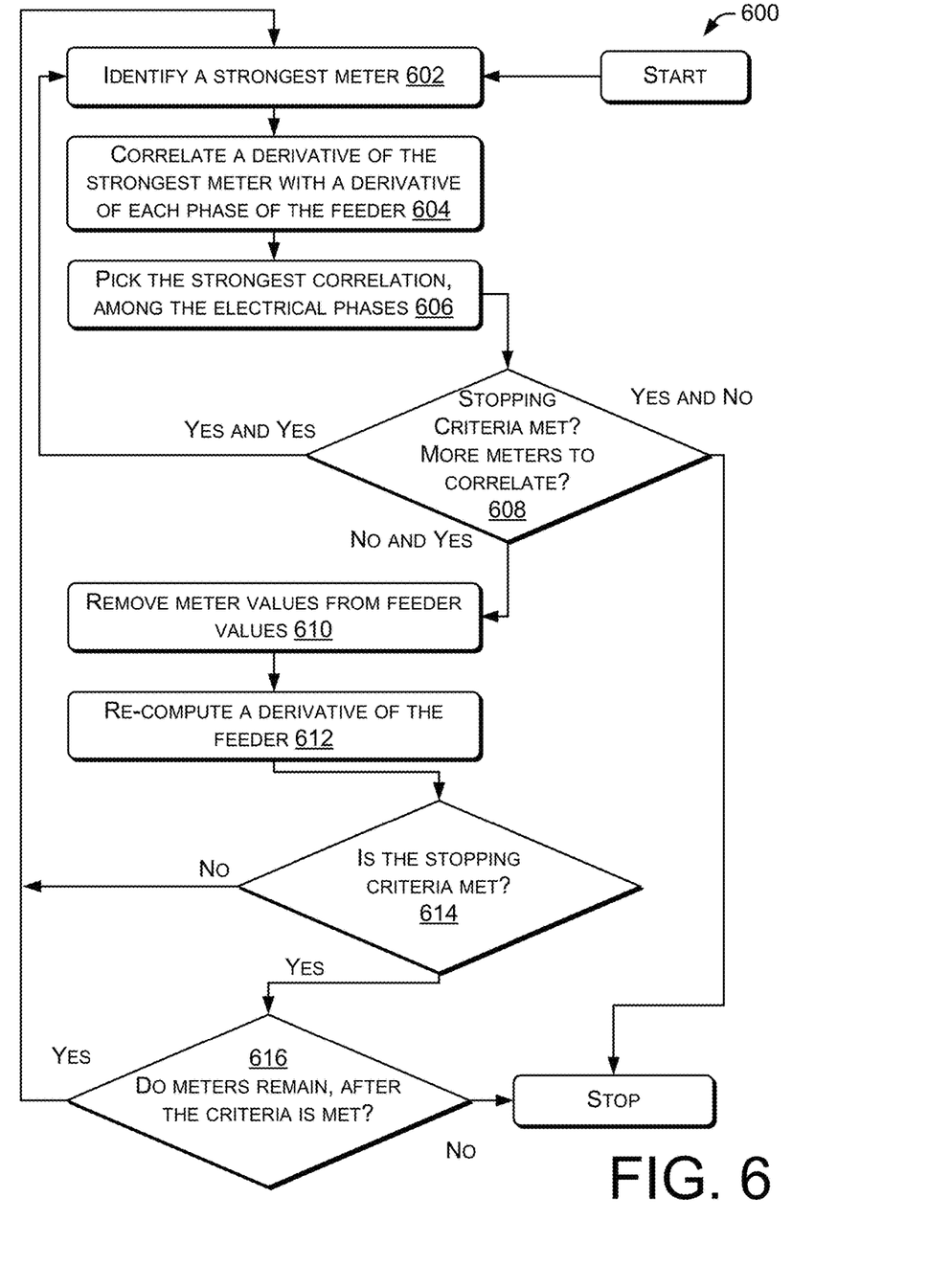
FIG. 6 is a flow diagram showing an example method by which aspects of network topology including electrical phase may be determined.
Figure 7:
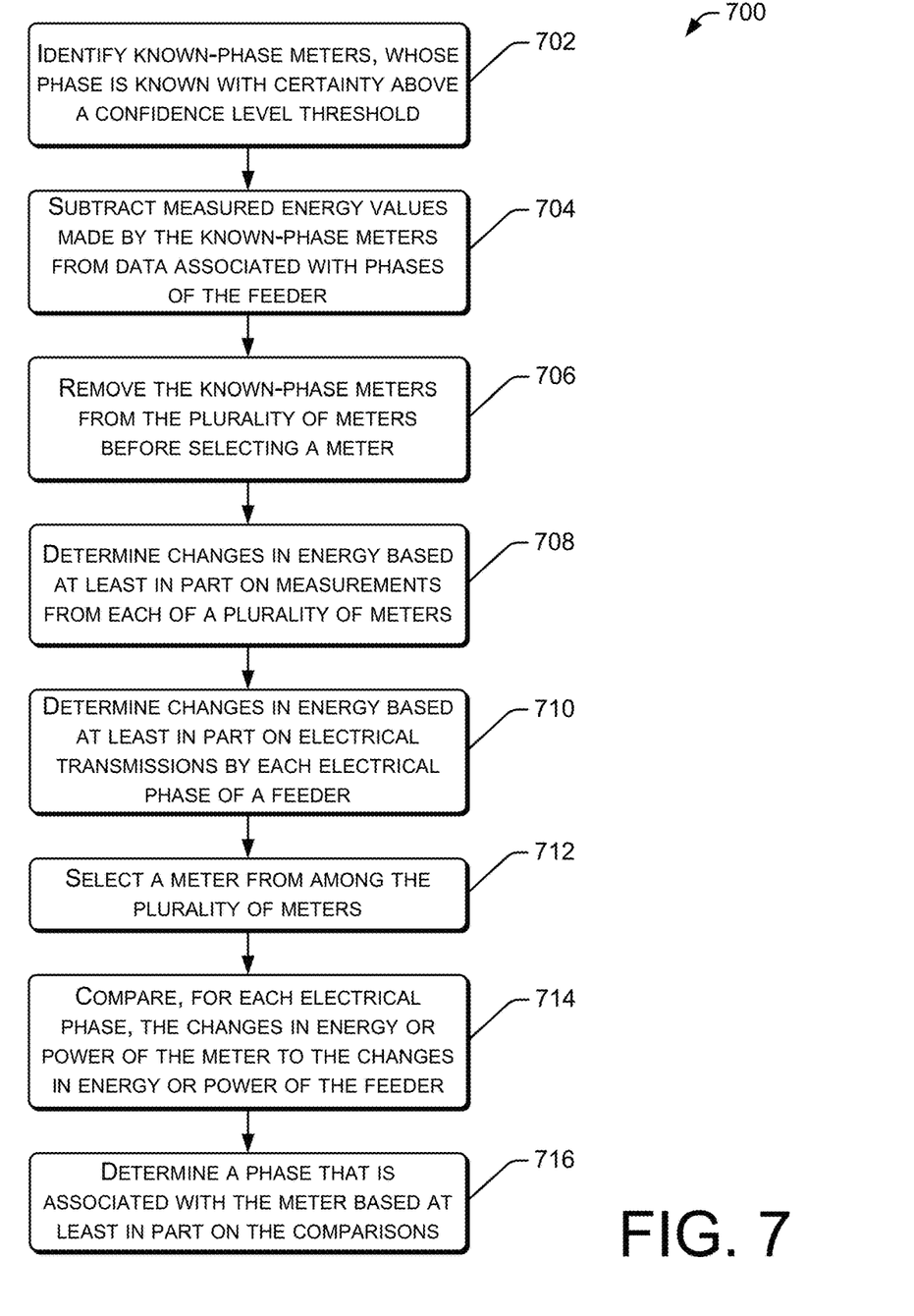
FIG. 7 is a flow diagram showing a further example method by which aspects of network topology including electrical phase may be determined.
Figure 8:
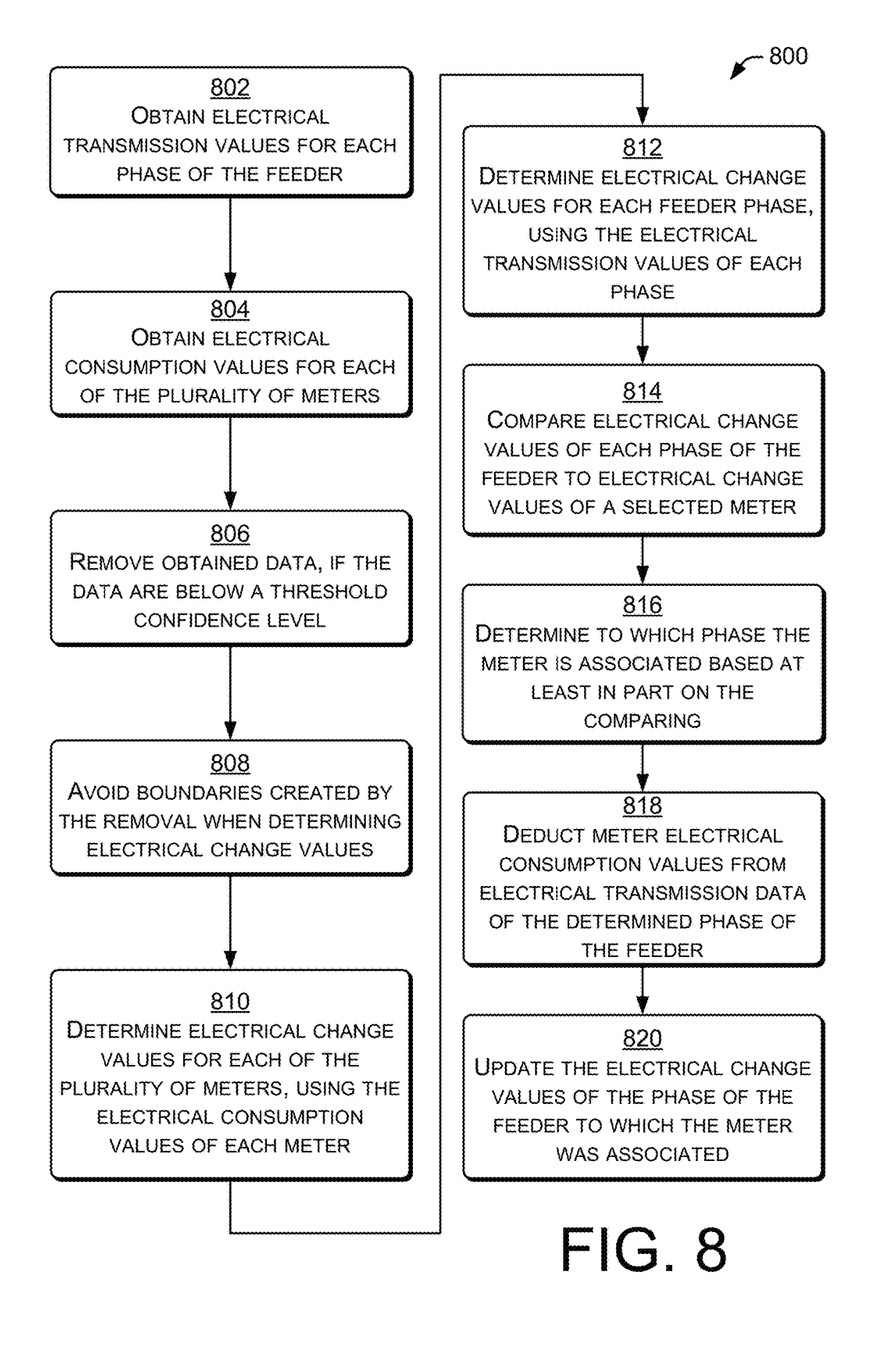
FIG. 8 is a flow diagram showing a still further example method by which aspects of network topology including electrical phase may be determined.

FIGS. 6-8 are flow diagrams showing an example processes which are representative of techniques for use to identify electrical phase use by network components. The processes may, but need not necessarily, be implemented in whole or in part by the central office 102 and/or the computing device 500.

FIG. 6 is a flow diagram showing an example method 600 by which aspects of network topology including electrical phase use by individual network components may be determined. At block 602, a strongest meter is identified. The strongest meter is the meter thought to have the strongest correlation to one of the three phases of electrical power. The meter may be selected based at least in part on a measure of derivative (or energy difference) peaks of each of the plurality of meters, such as quantity and magnitude of the peaks. Thus, the meter with the largest number of energy change peaks of a threshold magnitude may be selected. Examples of the derivative peaks are seen in graph 404 of FIG. 4. Alternatively or additionally, the strongest meter may be selected based at least in part on a measure of accumulated energy of each of the plurality of meters. That is, the meter that has measured the most kilowatt hours during the data-gathering period may be selected. In the example of FIG. 5, the meter selection module 510 can be utilized to select a meter.

At block 604, a derivative of the strongest meter is correlated with a derivative of each phase of the feeder. In the example of FIG. 5, the derivatives may be taken by the derivative module 514 and the correlation may be made by the correlation module 516.

At block 606, a strongest correlation is selected, thereby indicating the phase to which the meter is connected. For example, if the derivative of the energy (changes in energy) of the meter correlated most strongly to the derivative of the energy (changes in energy) supplied by phase B of the feeder, that would indicate that the meter is being supplied by phase B of the feeder (i.e., the meter is supplied by a transformer that is supplied by phase B of the feeder).

At block 608, checks are made to determine if a stopping criteria is met and if there are more meters to correlate. The stopping criteria is discussed with respect to the stopping criteria module 512. In one example, the stopping criteria is indicated when no electrical meters that have sufficient (threshold number and/or magnitude) energy change peaks and/or sufficient energy consumption values (total kWh during the energy-gathering) to suggest a strong correlation of the meters to an electrical phase may be obtained. The stopping criteria prevents the subtraction and re-computation actions of blocks 610, 612, but does not prevent further action unless no meters remain to be processed. However, if the stopping criteria is met and there are no more meters to correlate to phases of the feeder, then the algorithm concludes. If the stopping criteria is met and there are more meters to correlate, the stopping criteria prevents the actions of blocks 610 and 612, but blocks 602-606 repeat until there are no more meters to correlate. If the stopping criteria is not met and there are more meters to correlate, control moves to block 610.

At block 610, the energy values of the meter data are removed from the energy values of the feeder data. Thus, if the meter measured 2 kilowatt hours in a certain time period, then those kilowatt hours are subtracted from energy data associated with an appropriate phase (i.e., the phase to which the meter was associated at block 606) of the feeder. Thus, the remaining feeder data may be associated with the remaining meters.

At block 612, the derivative (or other change in energy data) of the feeder is then recomputed. This computation is required only with respect to the phase of the feeder which was changed by the subtraction of block 610.

At block 614, the stopping criteria are checked. In the example of FIG. 5, the stopping criteria are determined by stopping criteria module 512. Example stopping criteria include failure of any remaining meter to have a threshold number of derivative peaks over a threshold magnitude. Other stopping criteria include failure of any remaining meter to have a threshold value of total electrical consumption measurements. Such meters are unlikely to strongly associate with any phase, and subtraction of their power values from any phase of the feeder may degrade the data. If the stopping criteria is not met, the lower meters are processed at blocks 602 through 606. If the stopping criteria are met, at block 616 it is determined if more meters remain to be processed.

FIG. 7 is a flow diagram showing a further example method 700 by which aspects of network topology, including electrical phase use, may be determined.

At block 702, known-phase meters may be identified. Known-phase meters are electrical meters whose phase (i.e., the phase to which the meter is connected) is known with certainty above a confidence level threshold. Such meters may exist, for example, because they have been recently identified and verified by actual inspection of work crews or by an outage.

At block 704, measurement values from the known-phase meters may be deducted (e.g., subtracted) from data associated with the indicated phases of the feeder. In one example, if a meter has a known phase connection of phase B, and has measured a certain number of kilowatt hours over different time periods, that data may be subtracted from data associated with phase B of the feeder.

At block 706, the known-phase meters may be removed from the plurality of meters. The removal may be made before selecting the meter for which phase association is desired. Generally, the removal of known-phase meter from a plurality of meters for which phase identification is desired tends to simplify the phase-identification task.

At block 708, changes in energy of each of the plurality of meters may be determined. The changes in energy may be based at least in part on electrical consumption measurements from each of a plurality of meters. In one example, the changes in energy may be determined by taking a derivative of an energy use function or data, to thereby yield a change in energy function or data. If a smooth function is not available for differentiation, then differences in values may be taken, such as of a step or discrete function.

At block 710, changes in energy may be determined for a feeder. The changes may be based at least in part on measurements of each electrical phase (e.g., phase A, B and C of three-phase power) of the feeder. The measurements may have been taken at a substation supplying energy to the feeder. The changes may be based at least in part on data indicating energy or power transmitted by each phase of the feeder at different intervals of time. The changes in energy or power may be performed in a manner similar to the changes in energy or power at block 708.

At block 712, a meter is selected from among the plurality of meters. The selected meter may be the strongest meter, i.e., a meter which is thought to have characteristics that will allow correlation with an electrical phase. The selection of the meter may be based at least in part on a count of derivative peaks of a threshold magnitude of each of the plurality of meters. Such derivative peaks may be peaks in the changes in energy, and may be based on differentiation, the taking of differences, subtraction of discrete functions, etc. Example peaks are seen at graph 404 of FIG. 4. Alternatively or additionally, the selection of the meter may be based at least in part on a quantity of accumulated energy of each of the plurality of meters (e.g., a number of kilowatt hours measured by the meter over the data collection period). Thus, meters that measured more energy or power and/or that have more frequent and larger changes in energy use are favored for selection over meters that measured less energy and/or that have fewer changes in energy.

At block 714, the changes in energy of the meter may be compared to the changes in energy for each phase of the feeder. In one example, the comparison may be a mathematical correlation process, and may provide confidence intervals or other indicators that a meter is more closely associated with one phase of three-phase power than other phases. If the meter has a number of energy changes, those energy changes may correlate to energy changes in a particular phase of the feeder that supplied a customer associated with the meter. Accordingly, a meter with large energy use and numerous energy changes will likely correlate to the phase of the feeder that supplied power to the customer associated with the meter.

At block 716, a phase that is associated with the meter may be determined, based at least in part on the comparisons. The determination may be based at least in part on the comparison(s) and/or correlation(s) performed at block 714. When a phase has been determined, values associated with the measured energy of the meter (e.g., kilowatt hours within different timeslots) may be subtracted from the data associated with the correlating phase of the feeder. Removal of this data from the feeder data assists in the determination of the phase of the remaining meters.

FIG. 8 is a flow diagram showing an example method 800 by which aspects of network topology, including electrical phase use by meters, may be determined. At block 802, electrical transmission values for each phase of the feeder may be obtained. The electrical transmission values may be in the form of energy (e.g., kilowatts per time interval) or power. The values may be associated with a particular window in time, such as a particular range of minutes in a particular day. The electrical transmission values may be obtained over a number of days (e.g., 90 days or so) and may be taken over intervals (e.g., 15 minutes or less).

At block 804, electrical consumption values may be obtained for each of the plurality of meters. The electrical consumption values may be obtained over the same time period and for the same intervals as the electrical transmission values for each phase of the feeder.

At block 806, in some instances, data may be erroneous, corrupted and/or associated with a low confidence level. Such data may be removed from the electrical transmission values for each phase of the feeder and/or the electrical consumption values may be obtained for each of the plurality of meters, if the data are below a threshold confidence level. In one example of the removal, the data may be converted to zero or other value to indicate that it is not to be used.

At block 808, boundaries created by the data removal at block 806 may be avoided when determining electrical change values at blocks 810 and 812. For example, several minutes of data may be corrupted by network communications problems. The data captured during those minutes may be excluded from calculations. Care should be taken to not create artificial change values, due to the removal or "zeroing" of the data.

At block 810, electrical (power, energy, etc.) change values may be determined for each of the plurality of meters, using the electrical consumption values of each meter. In one example, electrical energy changes may be expressed as a derivative of measured electrical energy consumption values. At block 812, electrical (power, energy, etc.) change values may be determined for each feeder phase, using the electrical transmission values of each phase. In one example, the change values of blocks 810, 812 may be determined in a manner similar to blocks 708, 710, discussed above with respect to FIG. 7.

At block 814, electrical change values of each phase of the feeder may be compared to electrical change values of the meter. The comparison may be enabled by a correlation process, which may exceed a certain threshold or confidence criterion. The comparison may be performed in the manner discussed at block 714. At block 816, a phase to which the meter is associated may be determined. The determination may be based at least in part on the comparing step of block 814. Thus, the meter is connected to a particular electrical phase, which is determined, understood and/or realized at block 816.

At block 818, meter electrical consumption values may be deducted and/or subtracted from electrical transmission data of the determined phase of the feeder. By subtracting the meter values from the phase of the feeder, subsequent iterations of blocks 814 through 820 of FIG. 8 will more easily determine the phase of each additional meter selected from the plurality of meters.

At block 820, the electrical change values of the phase of the feeder to which the meter was associated may be updated. Since the measured values of the selected meter have been removed from the measured values of the meter-supplying phase of the feeder, the change data is not correct until the update has been performed.

Blocks 814 through 820 may be iterated, for each meter in the plurality of meters.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method, comprising:
receiving meter data from a first meter and a second meter to which power is provided by a transformer which is connected to a substation via a feeder, and wherein at least one of energy or power provided by each phase of the feeder changes over time;
selecting a meter from among the first meter and the second meter;
correlating changes in energy or power indicated by the received meter data at the selected meter with changes in energy or power provided by a first phase of the feeder, wherein the changes in energy or power at the selected meter are based at least in part on loads turned on or off at a site associated with the selected meter;
correlating the changes in energy or power at the selected meter with changes in energy or power provided by a second phase of the feeder, wherein the changes in energy or power at the selected meter are based at least in part on loads turned on or off at the site associated with the selected meter;
identifying a phase of the feeder whose changes in energy or power had a strongest correlation to the changes in energy or power measured at the selected meter; and
associating the selected meter with the identified phase.

2. The method of claim 1, additionally comprising:
correlating the changes in energy or power at the selected meter with changes in energy or power provided by a third phase of the feeder.

3. The method of claim 1, wherein selecting the meter comprises:
determining which of the first meter or the second meter has a larger number of energy-change-peaks; and
selecting that meter.

4. The method of claim 1, wherein selecting the meter comprises:
determining which of the first meter or the second meter has measured a largest number of kilowatt hours; and
selecting that meter.

5. The method of claim 1, wherein correlating the changes in energy or power measured by the selected meter with the changes in energy or power provided by the first phase of the feeder comprises:
correlating peaks indicating changes in energy or power measured by the selected meter with peaks indicating changes in energy or power provided by the first phase of the feeder.

6. The method of claim 1, additionally comprising:
deducting values of electrical energy or power measured by the selected meter from values of electrical energy or power provided by the identified phase of the feeder; and re-computing changes in energy or power for the identified phase of the feeder.

7. The method of claim 1, additionally comprising:
deducting electrical consumption data of the selected meter from electrical transmission data of the identified phase of the feeder; and
selecting a further meter to be associated with a phase of the feeder.

8. The method of claim 1, additionally comprising:
identifying one or more meters with less than a threshold value of total electrical consumption measurements; and
refraining from subtracting electrical consumption data of the identified one or more meters from electrical transmission data of any phase of the feeder.

9. The method of claim 1, additionally comprising:
identifying a known-phase meter whose phase is known with a certainty above a confidence level threshold;
subtracting values of electrical energy or power measured by the known-phase meter from values of electrical energy or power provided by the phase of the feeder associated with the known-phase meter; and
computing changes in energy or power provided by the phase of the feeder associated with the known-phase meter.

10. A computing device, comprising:
a processor;
a memory in communication with the processor;
instructions, stored in the memory, which when executed by the processor configure the computing device to perform actions comprising:
receiving, from a plurality of meters, meter data indicating measured electricity consumption;
selecting a meter having a largest measured electricity consumption from among the plurality of meters, wherein the selected meter is connected to a transformer;
correlating changes in energy or power measured by the selected meter with changes in energy or power provided by a first phase of a feeder, wherein at least one phase of the feeder is connected to the transformer, and wherein the feeder is connected to a substation;
correlating changes in energy or power measured by the selected meter with changes in energy or power provided by a second phase of the feeder;
identifying a phase of the feeder whose changes in energy or power have a strongest correlation to the changes in energy or power measured by the selected meter; and
associating the selected meter with the identified phase.

11. The computing device of claim 10, wherein the actions of selecting the meter comprise:
selecting a meter, based at least in part on quantity of changes in measured energy or power, and based at least in part on magnitude of the changes in measured energy or power, from among the plurality of meters.

12. The computing device of claim 10, wherein:
the changes in energy or power measured of the selected meter, and the changes in energy or power provided by the first phase of the feeder, correspond to changes in energy or power as appliances are turned on and off.

13. The computing device of claim 10, wherein correlating changes in energy or power measured by the selected meter with the changes in energy or power provided by the first phase of the feeder comprises:
correlating times of changes in energy or power measured by the selected meter with times of changes in energy or power in the first phase of the feeder.

14. The computing device of claim 10, wherein the actions additionally comprise:
deducting values of electrical energy or power measured by the selected meter from values of electrical energy or power provided by the identified phase of the feeder; and
computing changes in measured energy or power provided by the identified phase of the feeder.

15. One or more computer-readable media storing computer-executable instructions that, when executed by one or more processors, configure a computing device to perform acts comprising:
identifying a meter from among a first meter and a second meter based at least in part on quantity and magnitude of energy or power change peaks measured by each of the first meter and the second meter;
correlating location and magnitude of energy or power change peaks of the identified meter with location and magnitude of energy or power change peaks of a first phase of a feeder;
correlating location and magnitude of energy or power change peaks of the identified meter with location and magnitude of energy or power change peaks a second phase of the feeder; and
associating the identified meter with a phase of the feeder having a strongest correlation to the identified meter.

16. The one or more computer-readable media of claim 15, additionally comprising:
correlating location and magnitude of energy or power change peaks of the identified meter with a third phase of the feeder.

17. The one or more computer-readable media of claim 15, wherein the quantity and magnitude of energy or power change peaks comprises:
a relationship between magnitude of energy or power change and time.

18. The one or more computer-readable media of claim 15, wherein identifying the meter is also based at least in part on:
determining if the first meter or the second meter has a largest number of measured kilowatt hours.

19. The one or more computer-readable media of claim 15, wherein correlating location and magnitude of energy or power change peaks of the identified meter with location and magnitude of energy or power change peaks of the first phase of the feeder comprises:
correlating timing of changes in energy or power measured by the identified meter with timing of changes in energy or power delivered by the first phase of the feeder.

20. The one or more computer-readable media of claim 15, wherein the acts additionally comprise:
deducting values of electrical energy or power measured by the identified meter from values of electrical energy or power delivered by the phase of the feeder having the strongest correlation to the identified meter; and
computing location and magnitude of energy or power change peaks of the phase of the feeder having the strongest correlation to the identified meter.

* * * * *